April 30, 1968 A. GOETZBERGER 3,380,852
METHOD OF FORMING AN OXIDE COATING ON SEMICONDUCTOR BODIES
Filed Nov. 23, 1964
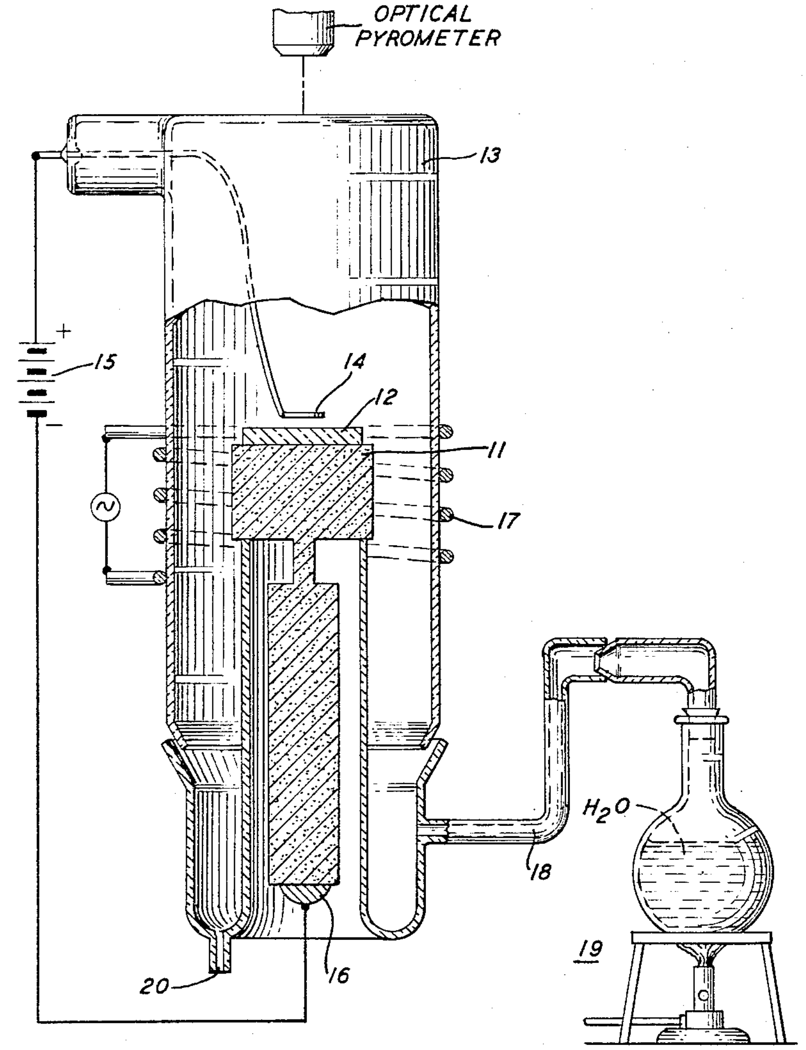
INVENTOR
A. GOETZBERGER
BY H. W. Lockhart
ATTORNEY United States Patent Office 3,380,852

Patented Apr. 30, 1968

3,380,852

METHOD OF FORMING AN OXIDE COATING ON SEMICONDUCTOR BODIES

Adolf Goetzberger, Berkeley Heights, N.J., assignor to Bell Telephone Laboratories, Incorporated, New York, N.Y., a corporation of New York Filed Nov. 23, 1964, Ser. No. 412,934
3 Claims. (Cl. 117—201)

ABSTRACT OF THE DISCLOSURE

A negative potential is applied to the surface of a semiconductor body through an electrode in the vicinity of the surface to remove positively charged ions therefrom during oxide formation. A particular technique includes an electric field of about 1000 volts per centimeter maintained during thermal growth of silicon oxide.

This invention relates to the fabrication of semiconductor devices and more particularly to the formation of high quality dielectric films on semiconductor device surfaces.

Thin dielectric films or coatings such as silicon oxide are used on semiconductor devices for several purposes including both electrical passivation and as dielectric spacing in field effect devices. Particularly for these uses, the films, usually of an inorganic oxide such as silicon oxide, should be electrically uniform and stable. Although a variety of techniques are known in the art for forming oxide films on semiconductor device surfaces, there continue to be difficulties in meeting the desired standards of stability and uniformity.

In accordance with this invention oxide films are formed on semiconductor device surfaces while the surface is maintained at a suitably high negative potential. As a result oxide films exhibiting a high degree of uniformity and electrical stability are produced.

Accordingly, an object of this invention is improved semiconductor devices.

An ancillary object is the formation of more stable and uniform oxide coatings on semiconductor devices.

The semiconductor art includes several well-known techniques for producing oxide coatings. These fall into the two general classifications; growth, and deposition. When the film is grown a surface layer of the semiconductor material itself is converted to the oxide form. So far as applicant is aware this method is restricted presently to silicon semiconductor material which is converted by oxidation using steam or oxygen or other suitable oxidizing atmosphere to convert the surface layer of the silicon to silicon oxide. Such techniques using steam oxidation are disclosed, for example, in United States Patent 2,930,722 to J. Ligenza.

The deposition technique for forming oxide films is applicable to almost all semiconductor materials and includes such processes as; evaporation deposition of an oxide from a heated source in a vacuum, cracking techniques using organic compounds such as, for example, silanes, and related techniques such as cathodic sputtering.

In accordance with this invention and utilizing any of the foregoing noted techniques for forming oxide coatings, an electrode is positioned at or near the surface of the semiconductor body upon which the oxide coating is being formed. By suitable electrical connections to the holding means for supporting the semiconductor body, a negative potential is applied ranging from 25 to at least 1000 volts per centimeter of separation between the electrode and the surface, and ranging to 5000 volts or more depending on considerations such as available power and safety. During the process of oxide formation the effect of the electrical field thus produced appears to be to neutralize positive ions which otherwise are trapped within the oxide film or at the interface between the oxide film and the semiconductor body. It is these positively charged ions which are believed to provide the means for conducting electric currents when the semiconductor device is placed in operation. These conductive paths have been termed channels, and they constitute the chief source of dissatisfaction with oxide films as a passivation medium at the present time.

Moreover, it has been found that improved films are attained when this negative potential is maintained only for the terminal portion of the oxide formation process. In other words, a portion of the oxide layer is grown without the presence of a field and then the field is applied during the last few minutes of film growth to achieve the advantages of this invention.

Thus one feature in accordance with this invention is an electrode arrangement for applying a relatively high voltage negative field to the surface of a semiconductor body during the formation of an oxide coating on the surface thereof.

The invention and its further objects and features will be more clearly understood from the following detailed description of a specific embodiment taken in connection with the drawing which shows in schematic form one arrangement for carrying out the invention.

Referring to the drawing there is shown a mounting pedestal 11 for holding the semiconductor body 12. Enclosing the upper portion of the pedestal and the semiconductor body is an envelope 13, typically of glass and vented to the atmosphere. A steam generator 19, shown schematically as a flask of water and a heating means, is connected by means of the supply tube 18 to the envelope 13. Surrounding a portion of the envelope is an induction coil 17 for heating the wafer to an elevated temperature during the oxide formation.

Typically the pedestal 11 is of a high purity material such as single crystal silicon of relatively high resistivity. Electrical connection is made to the lower end of the pedestal 11 by means of the low resistance metallic electrode 16. Within the envelope and spaced apart a suitable distance, typically one centimeter, from the semiconductor body surface is a wire electrode 14 which is connected to one terminal of a power source shown schematically as the battery 15. The electrode 16 at the lower end of the pedestal 11 is connected to the other terminal of the power source 15. Thus means are provided for applying a voltage from the electrode 14 to the semiconductor body and pedestal assembly. Schematically shown, above the envelope, is an optical pyrometer for observing the temperature of the semiconductor body 12 during the oxidation treatment. Advantageously, the electrode 14 is shaped so as to produce, as nearly as possible, a uniform field without at the same time including a full turn which might produce a radio frequency field.

In one specific embodiment, the semiconductor body 12 is of single crystal silicon. This body may contain a multiplicity of conductivity type regions as a consequence of previous fabrication processes and the oxidation treatment disclosed herein may be for the purpose of applying a protective, passivating coating to electrically stabilize the device. Or, the application of an oxide coating may be an intermediate step in the device fabrication, as for example, in the formation of the separating oxide film in a metal-oxide-semiconductor structure of the type disclosed in United States Patent 3,056,888 issued Oct. 2, 1962, to M. M. Atalla.

In any event, prior to mounting within the envelope 13 the semiconductor body 12 is cleaned by careful chemical treatment such as disclosed, for example, in the above-noted patent to Ligenza. The general purpose of such cleaning is to render the surface to be oxidized hydrophilic, clean, and slightly oxidized. This condition is achieved by methods comprising cleaning with an organic solvent to remove waxes or other organic contaminants, rinsing in clean water, slightly oxidizing the surface with an oxidizing agent and rinsing again. The treatment most advantageously used comprises immersing the surface of a silicon element in a mixture of hydrofluoric and nitric acids, rinsing, chemically cleaning by immersion in a hydrocarbon solvent, rinsing, treating in hot nitric acid, and rinsing the element once more before mounting in the envelope 13.

Suitable acid mixtures comprise six parts by volume of concentrated nitric acid to one part by volume of forty-eight percent hydrofluoric acid. Other acid mixtures ranging in concentration from greater than 20–1 to less than 1–1 can be used successfully as known in the art. The hydrocarbon solvent may be one such as benzene or xylene and the hot concentrated nitric acid may be typically at a temperature of 100 degrees centigrade. These preliminary cleaning operations have been found not to be critical to the achievement of consistent and improved results by means of this invention.

The thus cleaned semiconductor body 12 is mounted on the silicon pedestal 11 and the induction coil 17 is energized to raise the temperature of the body to the range of from 800 degrees to 1200 degrees centigrade. This is controlled by observation using the optical pyrometer. A voltage of more than about 25 volts then is applied to the circuit including the electrode 14, the air gap between the electrode 14 and the semiconductor body 12 and the pedestal 11 and electrode 16. Although the pedestal 11 is of high resistivity single crystal silicon its conductivity is relatively high compared to that of the air gap and semiconductor body 12. The steam generator 19 is activated and a copious supply of water vapor is fed to the envelope 13. This apparatus is shown as open to the atmosphere rather than being of the closed or bomb-type which is also disclosed in the above-noted Ligenza patent. However, the apparatus in accordance with this invention may be adapted for use in the bomb-type oxidation arrangement. The steam generation process is continued for a sufficient length of time to produce the desired thickness of oxide coating which results as a consequence of the thermal conversion of surface layers of the silicon semiconductor body itself. A drain 20 is shown for removing vapor from the envelope 13.

As previously noted, the steam generation process may be started before the field is applied and a significant oxide layer may be grown before the field is turned on. The improved results are attained if the field then is applied for the terminal portion of the oxide forming process. Thus, it appears that the character of the oxide-semiconductor interface is significant and that it can be relatively permanently improved during the final growth step when the final interface is formed.

The effectiveness of an applied field from the electrode 14 is enhanced by the magnitude of the applied voltage. Improved results have been observed using an electrode spacing of one centimeter, starting with D-C voltages as low as 25 volts. However, significantly improved results are achieved in the range from about 100 volts to 1000 volts. At the 1000 volt level the degree of improvement measured in terms of observed surface states measured against increasing voltage appears asymptotic. Thus as a practical matter for the specific embodiment disclosed, using a separation between the electrode 14 and the surface of the semiconductor body 12 of about one centimeter, produces an electric field of 1000 volts per centimeter and achieves significant improvement. However, voltages of the order of five to ten thousand may be employed without deleteriously affecting the semiconductor. Accordingly, it is deemed expedient to apply a higher field than 1000 volts per centimeter, for example, 1500 volts to insure optimum results. Thus, a practical range of field values is from about 100 volts to 1500 volts per centimeter.

As is known in the art, growth rates for oxide films are directly related to the temperature at which the substrate is maintained and the time during which the process is carried on. As stated hereinabove, the substrate temperature may be between about 800 degrees and 1200 degrees centigrade during the oxide formation process. In general, one limitation on this temperature is the effect on materials such as diffusants already within the semiconductor. Higher temperatures and longer times, when permissible, produce thicker oxide layers. The thickness of films may range from as thin as 300 Angstroms to as thick as 10,000 Angstroms depending upon the reason for having the oxide film on the device.

As mentioned above, in addition to the use of steam atmospheres to produce oxide films on silicon by thermal conversion such growth may be accomplished by supplying an oxygen or oxygen-water vapor mixture as the atmosphere within the envelope. These are well-known techniques. Moreover, where an oxide coating is desired on semiconductor materials such as germanium and certain of the Group III–Group V semiconductor compounds such as gallium arsenide, indium antimonide and the like which do not form enough suitable oxides by such conversion techniques, deposition methods may be employed. These include both the direct evaporation, in vacuum, of silicon oxide from the mono-oxide compound and other well-known techniques such as pyrolitic decomposition or "cracking," using organic silicon compounds from the group known as silanes. Other techniques for producing useful oxide coatings are those using cathodic sputtering as disclosed in the applications of Gobeli and Ligenza, Ser. No. 318,282, filed Oct. 23, 1963, and Ligenza, Ser. No. 358,473, filed Apr. 9, 1964, and assigned to the assignee hereof. In the use of the foregoing techniques, arrangements may be devised so that a suitably high negative field is applied in the vicinity of the semiconductor body surface being oxidized during the oxidation process. Thus it is to be understood that although the invention has been disclosed in terms of the specific embodiment herein, other arrangements may be devised by those skilled in the art which likewise will fall within the scope and spirit of the invention.

What is claimed is:

1. In the process of forming a high quality oxide coating on the surface of a silicon semiconductor body, the steps of cleaning said surface, and then exposing said surface to an oxidizing atmosphere while maintaining said surface at a negative electric field and at an elevated temperature, said negative field being maintained at least during the terminal portion of said oxide formation.

2. The process in accordance with claim 1 in which said field is in the range from about 100 to about 1500 volts per centimeter and said temperature is from about 800 degrees centigrade to 1200 degrees centigrade.

3. The process in accordance with claim 1 in which said field is maintained only during the terminal portion of said oxide formation.

References Cited

UNITED STATES PATENTS

| | | | |
|---|---|---|---|
| 3,100,723 | 8/1963 | Weed | 117—106 XR |
| 3,293,085 | 12/1966 | Smith et al. | 117—95 XR |

WILLIAM L. JARVIS, *Primary Examiner.*